United States Patent
Alenin et al.

(10) Patent No.: US 7,411,451 B2
(45) Date of Patent: Aug. 12, 2008

(54) CLASS AB FOLDED CASCODE STAGE AND METHOD FOR LOW NOISE, LOW POWER, LOW-OFFSET OPERATIONAL AMPLIFIER

(75) Inventors: Sergey V. Alenin, Tucson, AZ (US); Henry Surtihadi, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 113 days.

(21) Appl. No.: 11/396,869

(22) Filed: Apr. 3, 2006

(65) Prior Publication Data
US 2007/0229156 A1 Oct. 4, 2007

(51) Int. Cl.
*H03F 3/45* (2006.01)
(52) U.S. Cl. .................................. 330/252; 330/300
(58) Field of Classification Search ................ 330/252, 330/257, 300, 292
See application file for complete search history.

(56) References Cited

U.S. PATENT DOCUMENTS 6,542,030 B2 * 4/2003 Huijsing et al. ............. 330/252
6,801,087 B2 * 10/2004 Ausserlechner ............. 330/255

* cited by examiner

*Primary Examiner*—Robert Pascal
*Assistant Examiner*—Hieu P Nguyen
(74) *Attorney, Agent, or Firm*—Warren L. Franz; Wade J. Brady, III; Frederick J. Telecky, Jr.

(57) ABSTRACT

An amplifier circuit includes an pair of input transistors, the drains of which are connected to emitters of first and second cascode transistors. First and second controlled current sources are connected to the emitters of the first and second cascode transistors, respectively, and third and fourth controlled current sources are connected to the collectors thereof. A bias circuit controls the 4 controlled current sources in response to the emitter voltage of a pair of input transistors of an output stage the inputs of which are connected to the drains of the first and second cascode transistors.

23 Claims, 3 Drawing Sheets

CLASS AB FOLDED CASCODE STAGE AND METHOD FOR LOW NOISE, LOW POWER, LOW-OFFSET OPERATIONAL AMPLIFIER

BACKGROUND OF THE INVENTION

The present invention relates generally to amplifiers employing folded cascode topology, and more particularly to improved low noise, low quiescent current, low offset operational amplifiers having a large common mode input voltage range.

One of the most frequently used input-stage topologies which provides wide input common-mode range is the folded cascode arrangement, shown as a generalized block diagram in FIG. 1. The amplifier in FIG. 1 includes a pair of input transistors (not shown) in block 30, the base or gate of one input transistor being coupled to Vin– and the base or gate of the other input transistor being coupled to Vin+. A tail current source $I_0$ is coupled to the emitters or sources of the input transistors, and their collectors or drains are coupled to load resistors R1 and R2 and also to emitters or sources of a pair of cascode transistors (not shown), respectively, in block 31. The collectors or drains of the cascode transistors in block 31 are coupled by a load circuit 5 to $V_{CC}$ and to inputs of an output amplifier stage 9 which produces Vout. Compensation capacitor C1 is coupled between Vout and the (–) input of output stage 9, and compensation capacitor C2 is coupled between $V_{EE}$ and to the (+) input of output stage 9.

FIG. 2 shows a schematic diagram of a different and simpler amplifier configuration, in which the differential input transistor pair includes a pair of JFET input transistors J0 and J1 having their sources coupled to a tail current source $I_0$ and their gates coupled to Vin– and Vin+, respectively. The drains of input transistors J0 and J1 are coupled to $V_{EE}$ through NPN active load transistors Q17 and Q18 and degeneration resistors R1 and R2 as shown. The drains of input transistors J0 and J1 are connected to bases of the input transistors Q12 and Q13, respectively, of a second amplifier stage. The emitters of transistors Q12 and Q13 are connected to a tail current source $I_3$ and to the bases of active load transistors Q17 and Q18. The collectors of transistors Q12 and Q13 are coupled to an active load circuit Q14, Q15 of the second amplifier stage. A compensation capacitor C1 is coupled between the base and collector of transistor Q13, and compensation capacitor C2 is connected between the base of transistor Q12 and $V_{EE}$.

In the simpler differential pair topology shown in FIG. 2, the slew rate is determined simply by the magnitude of the tail current $I_0$ and the size of the compensation capacitor C1.

However, in the more complex folded cascode topology of FIG. 1, the slew rate is determined not only by the magnitude of the tail current source $I_0$ and the size of the compensation capacitor C1, but is additionally determined by the amount of current flowing through the cascode transistors in block 31.

Thus, when comparing the folded cascode topology of FIG. 1 to a simple differential pair topology as shown in FIG. 2, it can be seen that the folded cascode topology will need to have higher quiescent current to achieve comparable slewing performance.

In order to make the slew rate of an operational amplifier having the folded cascode circuitry of FIG. 1 comparable to the slew rate of a second stage or output stage that has the simple differential input pair Q12,Q13 in FIG. 2, the cascoding transistors in block 31 of FIG. 1 must conduct the same amount of current as the input pair transistors in block 30 of FIG. 1. Unfortunately, this not only causes higher quiescent current in the folded cascode amplifier in FIG. 1, but also approximately doubles the amount of current flowing into load resistors R1 and R2, and therefore approximately doubles the voltage drop across them. Consequently, the common mode input voltage range is substantially reduced in the folded cascode amplifier of FIG. 1 if it is designed to have slewing performance comparable to that of the simpler differential pair topology of FIG. 2.

As a practical matter, the resistances of load resistors R1 and R2 in the folded cascode amplifier of FIG. 1 cannot be substantially reduced because that would increase the folded cascode stage transconductance Gm presented to the cascoding transistors in block 31, which in turn would increase its noise and offset noise contribution. (It should be noted that folded cascode topology can also be implemented using current sources in place of resistors R1 and R2 in FIG. 1. However, although the cascode transistors in block 31 of FIG. 1 can be degenerated by very high output resistances of those current sources, in practice such current sources themselves become noise and offset contributors.)

In order to minimize the quiescent current and the noise contribution of the folded cascode transistors in block 31 of FIG. 1, the amount of current flowing through the folded cascode transistors can be reduced. Furthermore, deceasing the quiescent current through the cascode transistors in block 31 increases the output resistance of the folded cascode stage and that, in turn, increases the voltage gain of the amplifier. The improved voltage gain is useful to minimize the noise and offset voltage contributions of any following stages (if present) when the noise and offset voltage contributions are referred back to the input terminals of the pair of input transistors in block 30. Unfortunately, reducing the quiescent current through the folded cascode transistors in block 31 of FIG. 1 reduces the slew rate of the folded cascode amplifier, as explained above.

There are known "slew boost" techniques for improving slew rate when quiescent current in the folded cascode stage is reduced. However, the known slew boost techniques use nonlinear types of slew boost circuits that boost the current flowing through the folded cascode stage or bypassing it. However, employing a nonlinear slew boost circuit in an amplifier results in additional signal distortion.

There is an unmet need for a low noise, low offset operational amplifier which has improved common mode input voltage range and high slew rates.

There also is an unmet need for an operational amplifier using folded cascode topology with the folded cascode stage running lower current than the differential input stage for improved noise and offset performance and/or wider common mode input voltage range while providing slew rate performance determined by a full amount of output current of the differential input transistor pair, without substantial degradation of linearity when the operational amplifier approaches a slewing condition.

SUMMARY OF THE INVENTION

It is an object of the invention to provide a low noise, low offset operational amplifier which has improved common mode input voltage range and high slew rates.

It is another object of the invention to provide an operational amplifier using folded cascode topology with the folded cascode stage running lower current than the differential input stage for improved noise and offset performance and/or wider common mode input voltage range while providing slew rate performance determined by a full amount of output current of the differential input transistor pair, without substantial degradation of linearity when the operational amplifier approaches a slewing condition.

Briefly described, and in accordance with one embodiment, the present invention provides an amplifier circuit (10A) includes an pair of input transistors, the drains of which are connected to emitters of first (Q5) and second (Q6) cascode transistors. First ($I_6$) and second ($I_7$) controlled current sources are connected to the emitters of the first and second cascode transistors, respectively, and third ($I_4$) and fourth ($I_5$) controlled current sources are connected to the collectors thereof. A bias circuit (34) controls the four controlled current sources in response to the emitter voltage of a pair of input transistors (Q12,13) of a second stage (20) the inputs of which are connected to the collectors of the first and second cascode transistors.

In a described embodiment, and operational amplifier circuit (10A) includes an input stage (11) including first (J0) and second (J1) input transistors coupled to a first tail current source ($I_0$) and to first (R1) and second (R2) load devices, respectively, and a folded cascode circuit (21). The folded cascode circuit includes first (Q5) and second (Q6) cascode transistors each having a first electrode, a second electrode, and a control electrode, the first electrode of the first cascode transistor (Q5) being coupled by a first conductor (2) to the first input transistor (J0) and the first load device (R1), the first electrode of the second cascode transistor (Q6) being coupled by a second conductor (1) to the second input transistor (J1) and the second load device (R2), the control electrodes being coupled to a first bias voltage (BIAS1). A first controlled current source ($I_6$/Q3) is coupled between the first electrode of the first cascode transistor (Q5) and a first reference voltage ($V_{EE}$), a second controlled current source ($I_7$/Q4) is coupled between the first electrode of the second cascode transistor (Q6) and the first reference voltage ($V_{EE}$), a third controlled current source ($I_4$/Q7) is coupled between the second electrode of the first cascode transistor (Q5) and a second reference voltage ($V_{CC}$), and a fourth controlled current source ($I_5$/Q8) is coupled between the second electrode of the second cascode transistor (Q6) and the second reference voltage ($V_{CC}$). A second stage (20) has first (6) and second (7) inputs coupled to the second electrodes of the first (Q5) and second (Q6) cascode transistors, respectively. An output conductor (18) conducts an output signal (Vout), and a tail current conductor (8) is coupled to a second tail current source ($I_3$). The tail current conductor (8) conducts a voltage representative of a common mode voltage of the second stage. First (C2/C2A) and second (C1/C1A) compensation capacitors are coupled to the first (6) and second (7) inputs, respectively, of the output stage (20). A bias circuit (Q9,Q11,Q10) biases control terminals of the first (I6/Q3), second (I7/Q4), third (I4/Q7), and fourth (I5/Q8) controlled current sources in response to the voltage conducted by the tail current conductor (8).

In a described embodiment, the first (Q5) and second (Q6) cascode transistors are bipolar transistors, wherein the first electrodes are emitters, the second electrodes are collectors, and the control electrodes are bases. In a described embodiment, a third compensation capacitor (C2B) is coupled to the first conductor (2) and a fourth compensation capacitor (C1B) coupled to the second conductor (1), wherein the capacitance of the first compensation capacitor (C2A) is approximately equal to the capacitance of the third compensation capacitor (C2B), and wherein the capacitance of the second compensation capacitor (C1A) is essentially equal to the capacitance of the fourth compensation capacitor (C1B). The bias circuit (34) is a class AB control circuit, and causes a quiescent current through the first (Q5) and second (Q6) cascode transistors to be substantially less than a tail current supplied by the tail current source ($I_0$).

In a described embodiment, the first (J0) and second (G1) input transistors are junction field effect transistors (JFETs) each having a source coupled to a first tail current source ($I_0$), drains of the first (J0) and second (G1) input transistors being coupled to the first (2) and second (1) conductors, respectively. The first ($I_6$) and second ($I_7$) controlled current sources are NPN first (Q3) and second (Q4) transistors, and the third ($I_4$) and fourth ($I_5$) controlled current sources are PNP third (Q7) and fourth (Q8) transistors. The bias circuit (34) includes a first NPN bias transistor (Q11) having a base coupled to receive a second bias voltage (BIAS2), an emitter coupled to the tail current conductor (8) and to a collector and base of an NPN first current mirror input transistor (Q10) and to bases of the NPN first (Q3) and second (Q4) transistors, the NPN first current mirror input transistor (Q10) having an emitter coupled to the first reference voltage ($V_{EE}$), the first NPN bias transistor (Q11) having a collector coupled to a collector and base of a PNP second current mirror output transistor (Q9) and to bases of the PNP third (Q7) and fourth (Q8) transistors, the PNP second current mirror output transistor (Q9) having an emitter coupled to the second reference voltage ($V_{CC}$). The second stage (20) includes third (Q12) and fourth (Q13) input transistors, emitters of the third (Q12) and fourth (Q13) input transistors being coupled by the tail current conductor (8) to the second tail current source ($I_3$), collectors of the third (Q12) and fourth (Q13) input transistors being coupled to a load circuit (32), the collector of the fourth input transistor (Q13) being coupled to the output conductor (18). The load circuit (32) includes a PNP current mirror input transistor (Q14) having an emitter coupled to the second reference voltage ($V_{CC}$) and a base and collector connected to the collector of the third input transistor (Q12) and a base of a PNP current mirror output transistor (Q15) having an emitter coupled to the second reference voltage ($V_{CC}$) and a collector coupled to the output conductor (18).

The invention provides a method of operating an amplifier circuit (10A) including (1) an input stage (11) including first (J0) and second (J1) input transistors coupled to a first tail current source ($I_0$) and to first (R1) and second (R2) load devices, respectively, and (2) a folded cascode circuit (21) including first (Q5) and second (Q6) cascode transistors each having a first electrode, a second electrode, and a control electrode, the first electrode of the first cascode transistor (Q5) being coupled by a first conductor (2) to the first input transistor (J0) and the first load device (R1), the first electrode of the second cascode transistor (Q6) being coupled by a second conductor (1) to the second input transistor (J1) and the second load device (R2), the control electrodes being coupled to a first bias voltage (BIAS1), wherein the method includes providing a first controlled current source ($I_6$/Q3) coupled between the first electrode of the first cascode transistor (Q5) and a first reference voltage ($V_{EE}$), a second controlled current source ($I_7$/Q4) coupled between the first electrode of the second cascode transistor (Q5) and the first reference voltage ($V_{EE}$), and also providing a third controlled current source ($I_4$/Q7) coupled between the second electrode of the first cascode transistor (Q5) and a second reference voltage ($V_{CC}$), and a fourth controlled current source ($I_5$/Q8) coupled between the second electrode of the second cascode transistor (Q6) and the second reference voltage ($V_{CC}$). The method includes providing a second stage (20) having first (6) and second (7) inputs coupled to the second electrodes of the first (Q5) and second (Q6) cascode transistors, respectively, an output conductor (18) for conducting an output signal (Vout), and a tail current conductor (8) coupled to a second tail current source ($I_3$), the tail current conductor (8), and also includes biasing control terminals of the first (I6/Q3), second (I7/Q4), third (I4/Q7), and fourth (I5/Q8) controlled current sources by means of a bias circuit (34) in response to a signal conducted by the tail current conductor (8).

In one embodiment, the invention provides amplifier circuit (10A) including an input stage (11) including first (J0) and second (J1) input transistors coupled to a first tail current source ($I_0$) and to first (R1) and second (R2) load devices, respectively. A folded cascode circuit (21) includes first (Q5) and second (Q6) cascode transistors each having a first electrode, a second electrode, and a control electrode, the first electrode of the first cascode transistor (Q5) being coupled by a first conductor (2) to the first input transistor (J0) and the first load device (R1), the first electrode of the second cascode transistor (Q6) being coupled by a second conductor (1) to the second input transistor (J1) and the second load device (R2), the control electrodes being coupled to a first bias voltage (BIAS1). A controlled current source means includes a first controlled current source ($I_6$/Q3) coupled between the first electrode of the first cascode transistor (Q5) and a first reference voltage ($V_{EE}$), a second controlled current source ($I_7$/Q4) coupled between the first electrode of the second cascode transistor (Q5) and the first reference voltage ($V_{EE}$), a third controlled current source ($I_4$/Q7) coupled between the second electrode of the first cascode transistor (Q5) and a second reference voltage ($V_{CC}$), and a fourth controlled current source ($I_5$/Q8) coupled between the second electrode of the second cascode transistor (Q6) and the second reference voltage ($V_{CC}$). An output means (20) includes first (6) and second (7) inputs coupled to the second electrodes of the first (Q5) and second (Q6) cascode transistors, respectively, an output conductor (18) for conducting an output signal (Vout), and a tail current conductor (8) coupled to a second tail current source ($I_3$), the tail current conductor (8). The amplifier circuit (10A) includes a biasing means (34) for biasing control terminals of the first (I6/Q3), second (I7/Q4), third (I4/Q7), and fourth (I5/Q8) controlled current sources in response to a signal conducted by the tail current conductor (8).

DETAILED DESCRIPTION OF THE PREFERRED EMBODIMENTS

Figure 1:
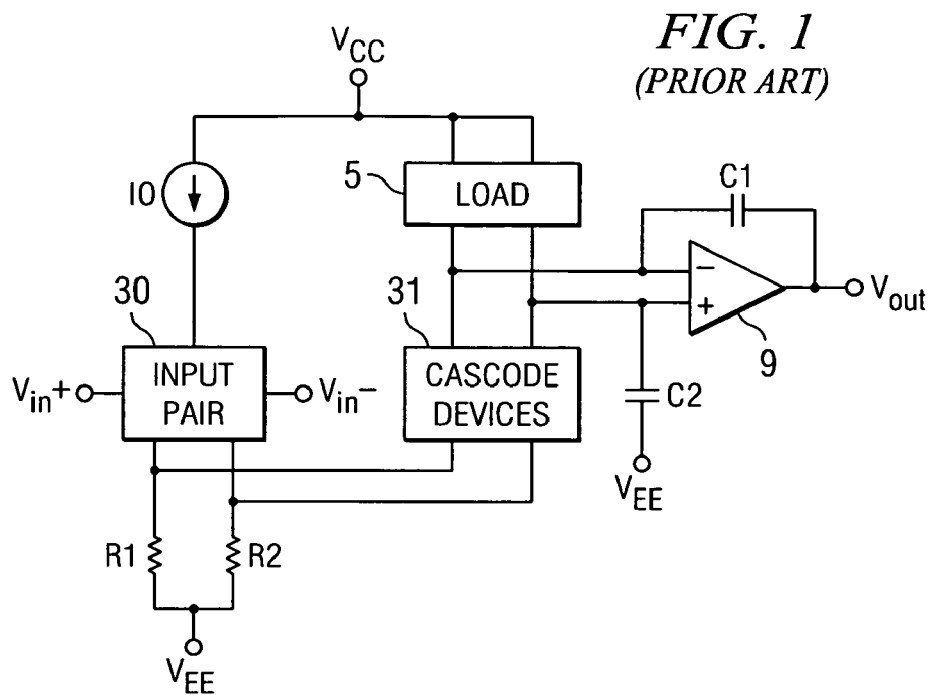
FIG. 1 is a is block diagram of a prior art operational amplifier.
Figure 2:
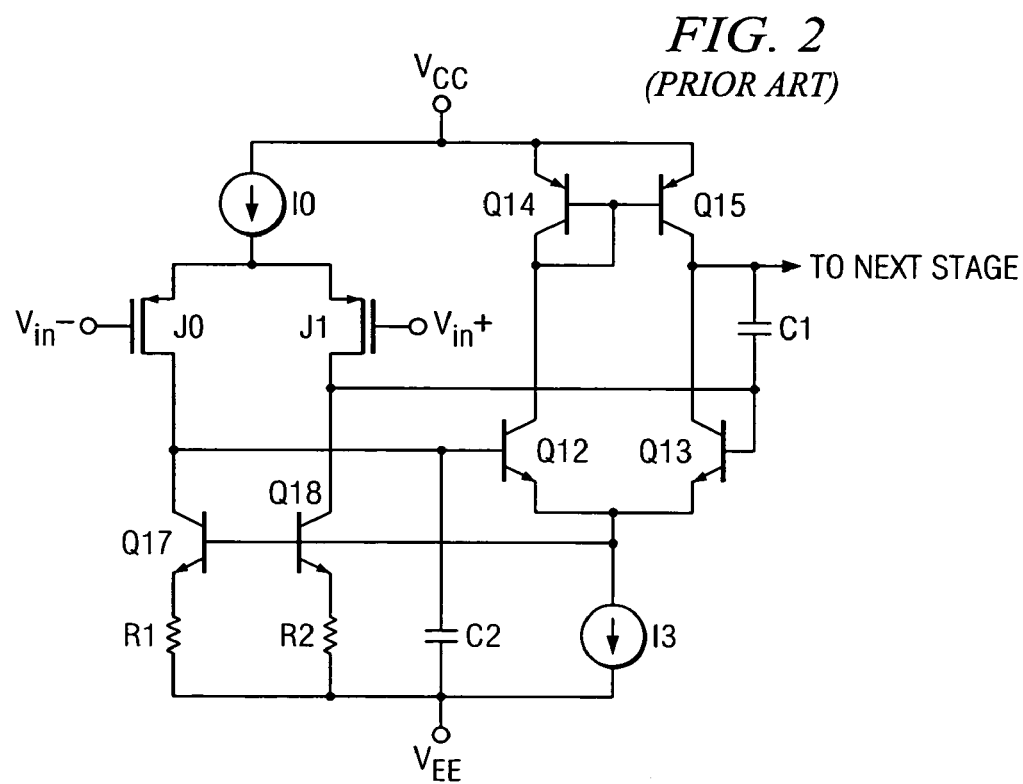
FIG. 2 is a schematic diagram of a prior art input stage including a folded cascode circuit.
Figure 3:
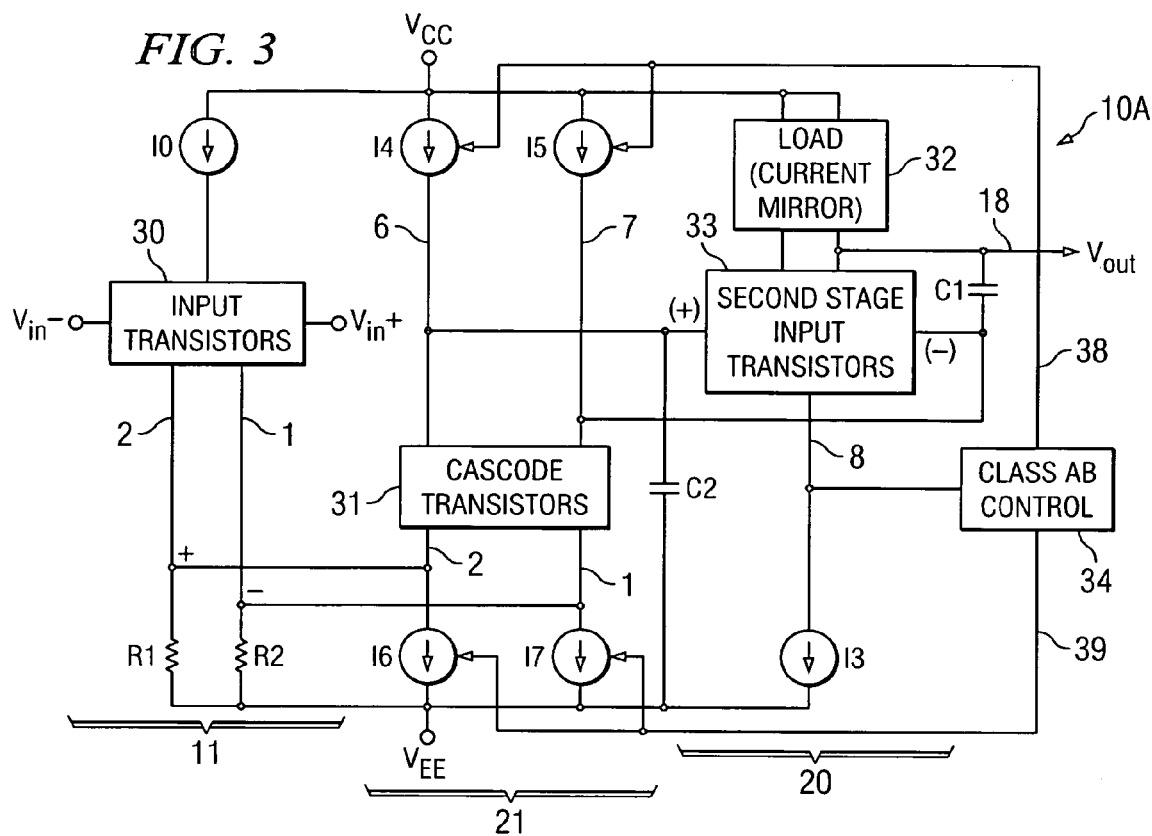
FIG. 3 is a detailed block diagram of one embodiment of an operational amplifier according to the present invention.

Referring to FIG. 3, an operational amplifier 10A includes an input stage 11, a folded cascode stage 21, and a second stage 20. Input stage 11 includes a pair of differentially coupled input transistors (not shown) in block 30 having emitters or sources coupled to a tail current source $I_0$ and having base or gate electrodes coupled to Vin− and Vin+, respectively. The collectors or drains of the input pair transistors also are connected by conductors 2 and 1 to load resistors R1 and R2, respectively.

Emitter or sources of a pair of cascode transistors (not shown) in block 31 of folded cascode stage 21 are coupled by conductors 2 and 1 to controlled current sources I6 and I7, respectively. Collectors or drains of the cascode transistors in block 31 are connected by conductors 6 and 7 to controlled current sources I4 and I5, respectively, of folded cascode stage 21. Conductors 6 and 7 are also connected to (+) and (−) inputs, respectively, of a pair of differentially coupled input transistors in block 33 of a second stage 20. The collectors or drains of the differentially coupled transistors in block 33 are connected to a load circuit 32 which typically includes a current mirror, in second stage 20. The output of the current mirror of load circuit 32 is coupled by conductor 18 to Vout and to one terminal of a compensation capacitor C1, the other terminal of which is connected to conductor 7. A compensation capacitor C2 is coupled between conductor 6 and $V_{EE}$. A tail current source $I_3$ is connected by conductor 8 to the emitters or sources of the pair of differentially coupled input transistors in block 33 and also to an input of a class AB control circuit 34.

One output of class AB control circuit 34 is connected by conductor 38 to the control inputs of controlled current sources I4 and I5, and another output of class AB control circuit 34 is connected by conductor 39 to the control inputs of controlled current sources I6 and I7. Class AB control circuit 34 keeps the quiescent currents of the two pairs of controlled current sources I6, I7 and I4, I5 at a predetermined low level, but under differential signal variation between Vin+ and Vin− class AB control circuit 34 increases the first pair of controlled currents I4 and I5 far beyond their quiescent value while reducing the second pair of controlled currents I6 and I7, or visa versa, depending on the polarity of the differential input voltage variation between Vin+ and Vin−.

In response to the voltage on conductor 8 in FIG. 3, class AB control circuit 34 together with controlled current sources I6,I7 and I4,I5 provide common mode feedback via a common mode voltage level on conductor 8, whereby the currents in conductors 38 and 39 determine the common mode input voltage applied to the second stage input transistors in block 33. Specifically, the common mode voltage level at conductor 8 is determined by class AB control circuit 34 input voltage when currents I6,I7 are equal to currents I4,I5, respectively. During slewing operation, class AB control circuit 34 assists in providing the full amount of input stage tail current $I_0$ to the Miller compensation capacitor C1.

Figure 4:
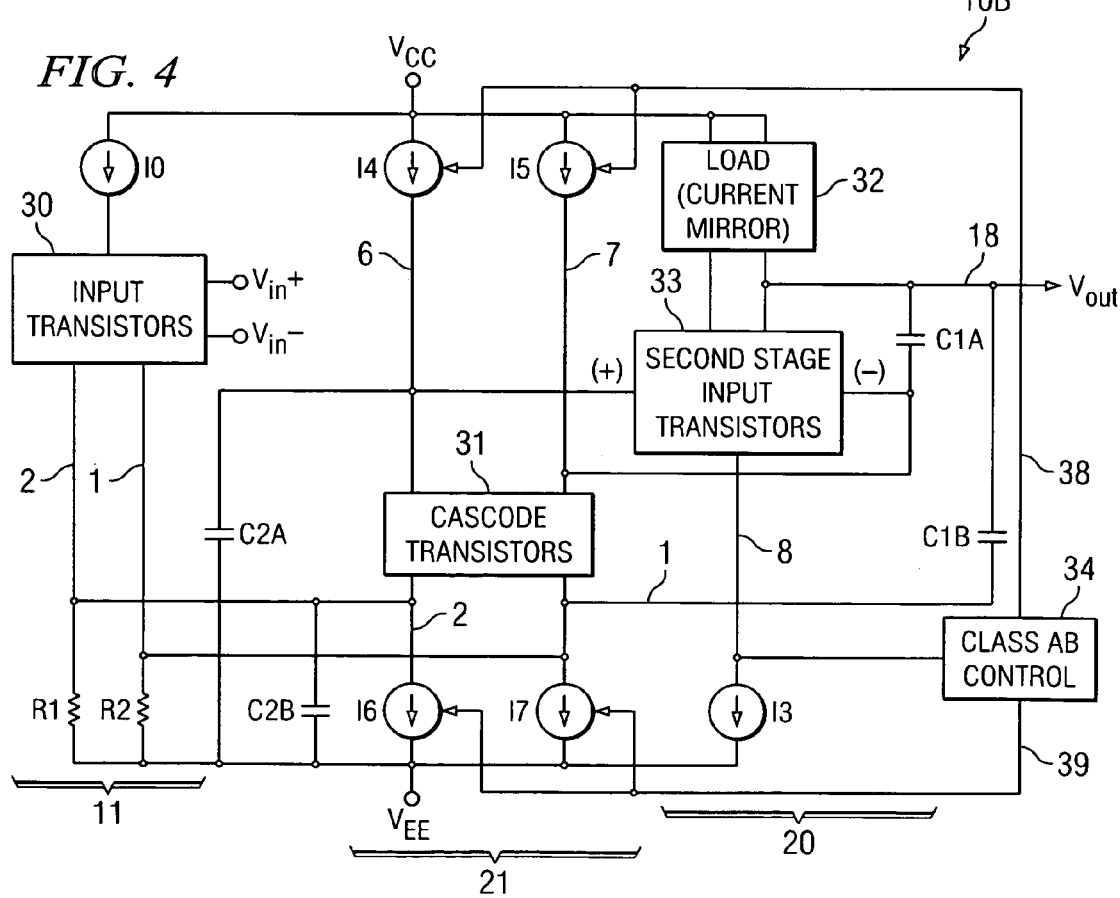
FIG. 4 is a detailed block diagram of another embodiment of an operational amplifier according to the present invention.

FIG. 4 shows an operational amplifier 10B which is substantially the same as operational amplifier 10A of FIG. 3 except that in FIG. 4 the compensation capacitors C1 and C2 are, in effect, "split" in half and the "split" portions are connected somewhat differently than in FIG. 3. Specifically, compensation capacitor C2A in FIG. 4 is connected between $V_{EE}$ and conductor 6, the same as compensation capacitor C2 in FIG. 3. However, the "split off" compensation capacitor C2B in FIG. 4 is connected between conductor 2 and $V_{EE}$. Compensation capacitor C1A is connected between conductor 7 and Vout conductor 18, the same as compensation capacitor C1 in FIG. 3, but "split offs" compensation capacitor C1B in FIG. 4 is connected between conductor 1 and Vout conductor 18.

This "splitting" of parts of the compensation capacitors C1 and C2 (of FIG. 3) is needed in order to maintain a full (i.e., based on 100% rather than 50% of $I_0$/C1) slew rate during negative transitions of the differential input Vin+ minus Vin−, as explained below.

Figure 5:
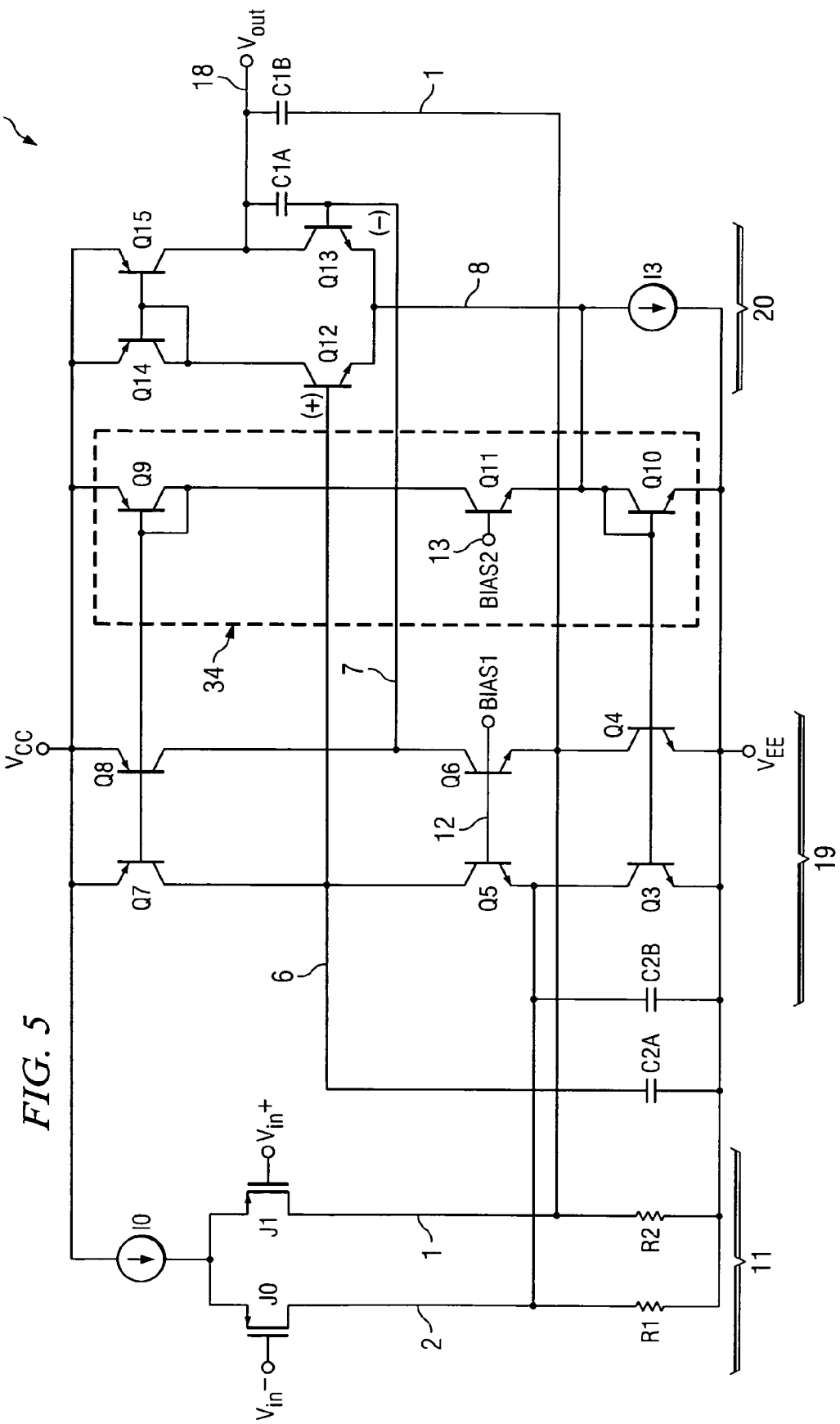
FIG. 5 is a schematic diagram of an operational amplifier as shown in FIG. 4.

Referring to FIG. 5, a detailed implementation of operational amplifier 10B of FIG. 4 is shown as an operational amplifier 10C that includes an input stage 11, a folded cascode stage 19, and a second stage or output stage 20. Input stage 11 includes P-channel JFETs (junction field effect transistors) J0 and J1 as the differentially coupled input pair in block 30 of FIG. 4. The gates of input transistors J0 and J1 are connected to Vin− and Vin+, respectively. The sources of input transistors J0 and J1 are connected to tail current source $I_0$, and their drains are connected by conductors 2 and 1 to one terminal of each of load resistors R1 and R2, respectively. The other terminal of each of load resistors R1 and R2 is connected to $V_{EE}$. NPN cascode transistors Q5 and Q6 (corresponding to block 31 of FIG. 4) have their bases connected by conductor 12 to a bias voltage BIAS1. Controlled current sources I6 and I7 of FIG. 4 are implemented in FIG. 5 by means of NPN current mirror output transistors Q3 and Q4 and also by diode-connected NPN current mirror input transistor Q10, the emitters of which all are connected to $V_{EE}$. The collectors of current mirror output transistors Q3 and Q4 are connected by conductors 2 and 1 to the emitters of cascode transistors Q5 and Q6, respectively. The bases of current mirror output transistors Q3 and Q4 are connected to the base and collector of NPN current mirror input transistor Q10.

The collectors of cascode transistors Q5 and Q6 are connected to conductors 6 and 7, respectively. Controlled current sources I4 and I5 in FIG. 4 are implemented in FIG. 5 by means of PNP current mirror output transistors Q7 and Q8, respectively, and also by PNP current mirror input transistor Q9, the emitters of which all are connected to $V_{CC}$. The collectors of current mirror output transistors Q7 and Q8 are connected to conductors 6 and 7, respectively, and their bases are connected to the base and collector of diode-connected PNP current mirror input transistor Q9. The collector and base of PNP current mirror input transistor Q9 are connected to the collector of an NPN cascode transistor Q11, the emitter of which is connected by conductor 8 to the base and collector of NPN current mirror input transistor Q10. The base of cascode transistor Q11 is connected by conductor 13 to a bias voltage BIAS2.

Differentially coupled NPN input transistors Q12 and Q13 of second stage 20 constitute a differentially coupled input transistor pair (corresponding to block 33 of FIG. 4), and have their bases connected to conductors 6 and 7, respectively, and their emitters connected by conductor 8 to a tail current source $I_3$. The collector of second stage input transistor Q12 is connected to the base and collector of a PNP current mirror input transistor Q14 and to the base of PNP output transistor Q15, and the collector of transistor Q13 is connected by conductor 18 to Vout and to the collector of PNP current mirror output transistor Q15. The emitters of current mirror transistors Q14 and Q15 are connected to $V_{CC}$. Current mirror transistors Q14 and Q15 correspond to the load circuit in block 32 of FIG. 4. The class AB control circuit 34 of FIG. 4 is formed by transistors Q9, Q10, and Q11 in FIG. 5.

Tail current sources $I_0$ and $I_3$ in FIG. 5 set the quiescent currents of the input transistors J0 and J1 and the second stage input transistors Q12 and Q13, respectively. The DC value of the bias voltage BIAS1 is chosen such that emitter voltages of cascode transistors Q5 and Q6 are equal to the tail current $I_0$ multiplied by the equivalent parallel resistance of resistors R1 and R2. The quiescent current through transistors Q9, Q10, and Q11 of class AB control circuit 34 in FIG. 5 is set by selecting an appropriate value of the bias voltage BIAS2.

This quiescent current should be low enough that the noise contribution of transistors Q3, Q4, Q7, and Q8 is minimized, and yet is not too low to provide adequate speed of folded cascode stage 19. Frequency compensation is provided by the "split" compensation capacitors C1A, C1B, C2A and C2B. The voltage drop across the base-emitter junctions of transistors Q10 and Q12 determines the collector voltage (on conductor 6) of cascode transistor Q5, which also is the common mode input voltage of second stage 20. Note that if necessary, an additional level shift can be provided by a voltage follower circuit (not shown) coupled between the collector of cascode transistor Q5 and the base of second stage input transistor Q12, and similarly, a voltage follower circuit (not shown) also can be coupled between the collector of cascode transistor Q6 and the base of second stage input transistor Q13, in order to provide enough headroom for cascode transistors Q5 and Q6 to function properly when the DC voltage drop across load resistors R1 and R2 is large.

If there is a positive change in the differential voltage between Vin+ and Vin− of operational amplifier 10C, the current through P-channel input JFET J0 increases while the current through input JFET J1 decreases. This causes the voltage drop across load resistor R1 to increase, which reduces the current through transistor Q5. Consequently, the collector voltage (on conductor 6) of cascode transistor Q5 and hence also the base voltage of second stage input transistor Q12 both increase. As the current through input JFET J1 decreases it contributes less to the current through load resistor R2, which causes the emitter current of cascode transistor Q6 to increase. This causes the collector voltage (on conductor 7) of cascode transistor Q6 and hence the base voltage of second stage input transistor Q13 to decrease.

The voltage on conductor 8 tracks the voltage on conductor 6 (as subsequently explained) with one VBE level shift down. Therefore the voltage on conductor 8 increases and the currents through transistors Q7, Q8 and Q9 decrease and the currents through transistors Q3, Q4 and Q10 increase.

The increase of current through transistor Q3 in FIG. 5 prevents cascode transistor Q5 from turning off and maintains a current balance in conductor 6. At the same time the current through transistor Q4 sums with variation in the current in load resistor R2, thus approximately doubling the increase of current through cascode transistor Q6. The imbalance of currents in conductor 7 is absorbed by the inverting input (base of transistor Q13) and the "effective" bottom plate of the "effective compensation capacitor" or "effective integrating capacitor" C1A+C1B=C1 of an integrator which can be considered to include cascode transistor Q6 along with second stage amplifier 20 and the effective integrating or feedback capacitor C1A+C1B=C1.

More specifically, varying currents which flow between conductor 1 of input stage 11 and the (−) input of the integrator formed by second stage 20 is absorbed by its feedback capacitor, i.e., by the integrating capacitances C1A and C1B, which are equal to C1. The lower plates of both compensation or feedback capacitors C1A and C1B are coupled directly, and indirectly without inversion by transistor Q6, respectively, to the (−) input of second stage 20. Therefore, the lower plates of both capacitors C1A and C1B receive the same signal, which is the signal on conductor 1 from input stage 11. The only difference is that the signal at the bottom plate of capacitor C1A passes without inversion through cascode transistor Q6. Half of the extra current from input stage 11 through conductor 1 is absorbed by capacitor C1A through conductor 7 and cascode transistor Q6 and the other half is absorbed directly from conductor 1 by capacitor C1B. When the polarity of the extra current from input stage 11 through conductor 1 causes it to turn cascode transistor Q6 off, the extra current is absorbed by capacitor C1B, preventing transistor Q6 from turning off, but the other half of the extra current, which is to be absorbed by capacitor C1A, comes not from transistor Q4 through transistor Q6, but instead is supplied by current mirror output transistor Q8 through conductor 7. In either case, the voltages on conductors 1 and 7 change very little (e.g., up to only about 50 millivolts) relative to the normal changes of Vout (e.g. between approximately $V_{CC}$ of +15 volts and $V_{EE}$ of −15 volts), and both conductors 1 and 7 therefore act as a virtual ground. (Conductors 1 and 7 both can be considered to be the inverting input of an operational amplifier operating in a feedback loop closed by capacitors C1A and C1B. Therefore, because the AC voltages across capacitors C1A and C1B are the same, the AC currents through the equal capacitors C1A and C1B are essentially equal during linear circuit operation.

It should be noted that during linear mode operation, the inverting input (conductor 7) of the second stage 20 tracks the non-inverting input (conductor 6) just as any operational amplifier in a feedback loop, and therefore the voltage on conductor 8 is determined by the voltage on conductor 6.

The increase of current through transistor Q3 in FIG. 5 prevents cascode transistor Q5 from turning off and maintains a current balance in conductor 6. At the same time the current through transistor Q4 sums with the current in load resistor R2, thus approximately doubling the increase of current through cascode transistor Q6. The imbalance of currents in conductor 7 is absorbed by the inverting input (base of transistor Q13 and bottom plates of split compensation capacitors C1A+C1B=C1 of an integrator formed by second stage amplifier 20 as explained above. It should be noted that the integrator can absorb current coming to its inverting input (base of transistor Q13) while it is in a linear mode of operation. That is, Vout (conductor 18) is not against either the $V_{CC}$ rail or the $V_{EE}$ rail and therefore can either increase or decrease, and the amount of incoming current is less than the maximum output current determined by tail current source $I_3$. During linear mode operation, the inverting input (conductor 7) of the second stage 20 tracks the non-inverting input (conductor 6) just as any operational amplifier in a feedback loop, and therefore the voltage on conductor 8 is determined by the voltage on conductor 6.

The slew rate is established by the effective "split" integrating capacitors C1A+C1B=C1 as explained above and the maximum amount of current injected to the inverting input of the integrator, which is a sum of the current through load resistor R2 ($I_{R2}=I_0/2$), and the current through transistor Q4 ($I_{Q4}=I_{Q3}=I_0-I_{R1}=I_0-I_0/2=I_0/2$), and the sum is $I_{R2}+I_{Q4}=I_0/2+I_0/2=I_0$.

Referring next to the case in which there is a negative differential voltage between Vin+ and Vin− of operational amplifier 10C in FIG. 5, but wherein for the purpose of analysis the "un-split" compensation capacitor C1 of FIG. 3 is connected between Vout and conductor 7, the current through input JFET J0 decreases. Consequently, more of the current through load resistor R1 flows through cascode transistor Q5 and pulls down the base voltage of second stage input transistor Q12. That decreases the voltage on conductor 8, which causes cascode transistor Q11 to turn on harder, and therefore increases the current through PNP current mirror input transistor Q9. Consequently, the currents through PNP current mirror output transistors Q7 and Q8 increase and balance the current of cascode transistor Q5 (which prevents the voltage on conductor 6 from decreasing further), and so at a maximum the current in cascode transistor 5 becomes equal to the amount of the DC or quiescent current through load resistor R1, which is $I_0/2$. Transistor Q3, transistor Q4, and transistor Q10 are almost off when the voltage on conductor 8 decreases. The transient current flowing through PNP current mirror output transistor Q8 ($I_{Q8}=I_{Q7}=I_{Q5}=I_{R1}=I_0/2$) provides only half of the current needed to charge the "un-split" capacitance of Miller compensation capacitor C1 (of FIG. 3). The other half of the current for charging that amount of compensation capacitance comes from input JFET J1 as its current increases to the value of tail current $I_0$ after subtracting the amount $I_0/2$ which flows into load resistor R2.

It can be seen that the "splitting" of compensation capacitor C1 of FIG. 3 into compensation capacitors C1A and C1B as shown in FIGS. 4 and 5 is needed because the current from input JFET J1 in FIG. 5 (which is equal to $I_0/2$) cannot pass through NPN cascode transistor Q6 from emitter to collector. If the "combined" or "un-split" compensation capacitor C1 as shown in FIG. 3 were to be connected between the collector of second stage input transistor Q13 and the collector of cascode transistor Q6 in FIG. 5, the output slew rate would be decreased by half, because the only current charging C1 would be the current of transistor Q8 equal to $I_0/2$ as explained above, not the full amount of tail current $I_0$. At the same time the current of input JFET J1 which has been increased to the full amount of tail current source $I_0$ is "lost" as it turns transistor Q6 off but can not pass through it to the base of input transistor Q13 and the "un-split" Miller capacitor C1 of FIG. 3 connected, for purposes of comparison, between Vout and conductor 7.

However, if half of compensation capacitor C1 of FIG. 3, i.e. C1B, is connected between the emitter of transistor Q6 and Vout in FIG. 5, then a current equal to $I_{J1}-I_{R2}=I_0-I_0/2=I_0/2$ can flow directly through C1B=C1/2, and a current through current mirror transistor Q8 equal to $I_0/2$ flows through C1A=C1/2, thereby providing the full output slew rate of $I_0$ (C1=C1A+C1B), along with the previously mentioned benefits of low noise, low-offset, and improved common mode input voltage range.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. An operational amplifier circuit comprising:
   (a) an input stage including first and second input transistors coupled to a first tail current source and to first and second load devices, respectively;
   (b) a folded cascode circuit including
      i. first and second cascode transistors each having a first electrode, a second electrode, and a control electrode, the first electrode of the first cascode transistor being coupled by a first conductor to the first input transistor and the first load device, the first electrode of the second cascode transistor being coupled by a second conductor to the second input transistor and the second load device, the control electrodes being coupled to a first bias voltage,
      ii. a first controlled current source coupled between the first electrode of the first cascode transistor and a first reference voltage, a second controlled current source coupled between the first electrode of the second cascode transistor and the first reference voltage, a third controlled current source coupled between the second electrode of the first cascode transistor and a second reference voltage, and a fourth controlled current source coupled between the second electrode of the second cascode transistor and the second reference voltage;
   (c) a second stage having first and second inputs coupled to the second electrodes of the first and second cascode transistors, respectively, an output conductor for conducting an output signal, and a tail current conductor coupled to a second tail current source, the tail current conductor having a node at which a voltage representative of a common mode input voltage of the second stage is established, and first and second compensation capacitors coupled to the first and second inputs, respectively, of the output stage; and (d) a bias circuit, coupled to the second stage node, for biasing control terminals of the first, second, third, and fourth controlled current sources in response to the common mode input voltage established at the tail current conductor.

2. The operational amplifier circuit of claim 1 wherein the first and second cascode transistors are bipolar transistors, and wherein the first electrodes are emitters, the second electrodes are collectors, and the control electrodes are bases.

3. An operational amplifier circuit comprising:
an input stage including first and second input transistors coupled to a first tail current source and to first and second load devices, respectively;
a folded cascode circuit including
  i. first and second cascode transistors each having a first electrode, a second electrode, and a control electrode, the first electrode of the first cascode transistor being coupled by a first conductor to the first input transistor and the first load device, the first electrode of the second cascode transistor being coupled by a second conductor to the second input transistor and the second load device, the control electrodes being coupled to a first bias voltage,
  ii. a first controlled current source coupled between the first electrode of the first cascode transistor and a first reference voltage, a second controlled current source coupled between the first electrode of the second cascode transistor and the first reference voltage, a third controlled current source coupled between the second electrode of the first cascode transistor and a second reference voltage, and a fourth controlled current source coupled between the second electrode of the second cascode transistor and the second reference voltage;
a second stage having first and second inputs coupled to the second electrodes of the first and second cascode transistors, respectively, an output conductor for conducting an output signal, and a tail current conductor coupled to a second tail current source, the tail current conductor establishing a voltage representative of a common mode input voltage of the second stage, and first and second compensation capacitors coupled to the first and second inputs, respectively, of the output stage;
a bias circuit for biasing control terminals of the first, second, third, and fourth controlled current sources in response to the common mode input voltage established by the tail current conductor;
a third compensation capacitor coupled to the first conductor; and
a fourth compensation capacitor coupled to the second conductor.

4. The operational amplifier circuit of claim 3 wherein the capacitance of the first compensation capacitor is approximately equal to the capacitance of the third compensation capacitor, and wherein the capacitance of the second compensation capacitor is approximately equal to the capacitance of the fourth compensation capacitor.

5. The operational amplifier circuit of claim 3 wherein the bias circuit is a class AB control circuit.

6. The operational amplifier circuit of claim 2 An operational amplifier circuit comprising:
an input stage including first and second input transistors coupled to a first tail current source and to first and second load devices, respectively;
a folded cascode circuit including
  i. first and second cascode transistors each having a first electrode, a second electrode, and a control electrode, the first electrode of the first cascode transistor being coupled by a first conductor to the first input transistor and the first load device, the first electrode of the second cascode transistor being coupled by a second conductor to the second input transistor and the second load device, the control electrodes being coupled to a first bias voltage,
  ii. a first controlled current source coupled between the first electrode of the first cascode transistor and a first reference voltage, a second controlled current source coupled between the first electrode of the second cascode transistor and the first reference voltage, a third controlled current source coupled between the second electrode of the first cascode transistor and a second reference voltage, and a fourth controlled current source coupled between the second electrode of the second cascode transistor and the second reference voltage;
a second stage having first and second inputs coupled to the second electrodes of the first and second cascode transistors, respectively, an output conductor for conducting an output signal, and a tail current conductor coupled to a second tail current source, the tail current conductor establishing a voltage representative of a common mode input voltage of the second stage, and first and second compensation capacitors coupled to the first and second inputs, respectively, of the output stage; and
a bias circuit for biasing control terminals of the first, second, third, and fourth controlled current sources in response to the common mode input voltage established by the tail current conductor;
wherein the bias circuit causes a quiescent current through the first and second cascode transistors to be substantially less than a tail current supplied by the tail current source.

7. The operational amplifier of claim 3 wherein the first and second input transistors are junction field effect transistors (JFETs) each having a source coupled to a first tail current source, drains of the first and second input transistors being coupled to the first and second conductors, respectively.

8. The operational amplifier of claim 3 wherein the first and second controlled current sources are NPN first and second transistors, and wherein the third and fourth controlled current sources are PNP third and fourth transistors.

9. The operational amplifier circuit of claim 8 wherein the bias circuit includes a first NPN bias transistor having a base coupled to receive a second bias voltage, an emitter coupled to the tail current conductor and to a collector and base of an NPN first current mirror input transistor and to bases of the NPN first and second transistors, the NPN first current mirror input transistor having an emitter coupled to the first reference voltage, the first NPN bias transistor having a collector coupled to a collector and base of a PNP second current mirror output transistor and to bases of the PNP third and fourth transistors, the PNP second current mirror output transistor having an emitter coupled to the second reference voltage.

10. The operational amplifier circuit of claim 3 wherein the second stage includes third and fourth input transistors, emitters of the third and fourth input transistors being coupled by the tail current conductor to the second tail current source, collectors of the third and fourth input transistors being coupled to a load circuit, the collector of the fourth input transistor being coupled to the output conductor.

11. The operational amplifier circuit of claim 10 wherein the load circuit includes a PNP current mirror input transistor having an emitter coupled to the second reference voltage and a base and collector connected to the collector of the third input transistor and a base of a PNP current mirror output transistor having an emitter coupled to the second reference voltage and to the output conductor.

12. A method of operating an amplifier circuit including (1) an input stage including first and second input transistors coupled to a first tail current source and to first and second load devices, respectively, and (2) a folded cascode circuit including first and second cascode transistors each having a first electrode, a second electrode, and a control electrode, the first electrode of the first cascode transistor being coupled by a first conductor to the first input transistor and the first load device, the first electrode of the second cascode transistor being coupled by a second conductor to the second input transistor and the second load device, the control electrodes being coupled to a first bias voltage, the method comprising:
  (a) providing a first controlled current source coupled between the first electrode of the first cascode transistor and a first reference voltage, a second controlled current source coupled between the first electrode of the second cascode transistor and the first reference voltage, and also providing a third controlled current source coupled between the second electrode of the first cascode transistor and a second reference voltage, and a fourth controlled current source coupled between the second electrode of the second cascode transistor and the second reference voltage;
  (b) providing a second stage having first and second inputs coupled to the second electrodes of the first and second cascode transistors, respectively, an output conductor for conducting an output signal, and a tail current conductor coupled to a second tail current source, the tail current conductor having a node at which a voltage representative of a common mode input voltage of the second stage is established; and
  (c) biasing control terminals of the first, second, third, and fourth controlled current sources by means of a bias circuit, coupled to the second stage node, in response to the common mode input voltage established at the tail current conductor.

13. The method of claim 12 including a first compensation capacitor between the first input of the second stage and one of the first and second reference voltages, and coupling a second compensation capacitor between the output conductor and the second input of the second stage.

14. A method of operating an amplifier circuit including (1) an input stage including first and second input transistors coupled to a first tail current source and to first and second load devices, respectively, and (2) a folded cascode circuit including first and second cascode transistors each having a first electrode, a second electrode, and a control electrode, the first electrode of the first cascode transistor being coupled by a first conductor to the first input transistor and the first load device, the first electrode of the second cascode transistor being coupled by a second conductor to the second input transistor and the second load device, the control electrodes being coupled to a first bias voltage, the method comprising:
  providing a first controlled current source coupled between the first electrode of the first cascode transistor and a first reference voltage, a second controlled current source coupled between the first electrode of the second cascode transistor and the first reference voltage, and also providing a third controlled current source coupled between the second electrode of the first cascode transistor and a second reference voltage, and a fourth controlled current source coupled between the second electrode of the second cascode transistor and the second reference voltage;

providing a second stage having first and second inputs coupled to the second electrodes of the first and second cascode transistors, respectively, an output conductor for conducting an output signal, and a tail current conductor coupled to a second tail current source;

biasing control terminals of the first, second, third, and fourth controlled current sources by means of a bias circuit in response to a signal conducted by the tail current conductor;

coupling a first compensation capacitor between the first input of the second stage and one of the first and second reference voltages;

coupling a second compensation capacitor between the output conductor and the second input of the output stage;

coupling a third compensation capacitor coupled between the first conductor and one of the first and second reference voltages; and coupling a fourth compensation capacitor between the output conductor and the second conductor.

15. The method of claim 14 including providing approximately equal capacitances for the first and third compensation capacitors and providing approximately equal capacitances for the second and fourth compensation capacitors.

16. A method of operating an amplifier circuit including (1) an input stage including first and second input transistors coupled to a first tail current source and to first and second load devices, respectively, and (2) a folded cascode circuit including first and second cascode transistors each having a first electrode, a second electrode, and a control electrode, the first electrode of the first cascode transistor being coupled by a first conductor to the first input transistor and the first load device, the first electrode of the second cascode transistor being coupled by a second conductor to the second input transistor and the second load device, the control electrodes being coupled to a first bias voltage, the method comprising:
  providing a first controlled current source coupled between the first electrode of the first cascode transistor and a first reference voltage, a second controlled current source coupled between the first electrode of the second cascode transistor and the first reference voltage, and also providing a third controlled current source coupled between the second electrode of the first cascode transistor and a second reference voltage, and a fourth controlled current source coupled between the second electrode of the second cascode transistor and the second reference voltage;

providing a second stage having first and second inputs coupled to the second electrodes of the first and second cascode transistors, respectively, an output conductor for conducting an output signal, and a tail current conductor coupled to a second tail current source;

biasing control terminals of the first, second, third, and fourth controlled current sources by means of a bias circuit in response to a signal developed at the tail current conductor; and operating the bias circuit to cause quiescent currents through the first and second cascode transistors, respectively, to be substantially less than a tail current supplied by the first tail current source.

17. The method of claim 16 including operating the bias circuit to cause the quiescent currents to be sufficiently low to produce a predetermined low value of noise contribution by the first, second, third, and fourth controlled current sources.

18. The method of claim 16 including operating the bias circuit to determine a common mode input voltage of the second stage.

19. The method of claim 12 wherein step (c) includes biasing the control terminals of the first, second, third, and fourth controlled current sources by means of a class AB bias circuit.

20. An amplifier circuit including
   (a) an input stage including first and second input transistors coupled to a first tail current source and to first and second load devices, respectively;
   (b) a folded cascode circuit including first and second cascode transistors each having a first electrode, a second electrode, and a control electrode, the first electrode of the first cascode transistor being coupled by a first conductor to the first input transistor and the first load device, the first electrode of the second cascode transistor being coupled by a second conductor to the second input transistor and the second load device, the control electrodes being coupled to a first bias voltage;
   (c) means for providing a first controlled current source coupled between the first electrode of the first cascode transistor and a first reference voltage, a second controlled current source coupled between the first electrode of the second cascode transistor and the first reference voltage, a third controlled current source coupled between the second electrode of the first cascode transistor and a second reference voltage, and a fourth controlled current source coupled between the second electrode of the second cascode transistor and the second reference voltage;
   (d) output means having first and second inputs coupled to the second electrodes of the first and second cascode transistors, respectively, an output conductor for conducting an output signal, and a tail current conductor coupled to a second tail current source, the tail current conductor having a node at which a voltage representative of a common mode voltage of the first and second inputs is established; and
   (e) means, coupled to the output means node, for biasing control terminals of the first, second, third, and fourth controlled current sources in response to the common mode input voltage established at the tail current conductor.

21. The operational amplifier circuit of claim 1 wherein the bias circuit includes a first bias transistor having a first electrode, a second electrode and a control electrode, the control electrode coupled to receive a second bias voltage, the first electrode coupled to the tail current conductor node and to a first electrode and control electrode of a first current mirror transistor, the first current mirror transistor having a second electrode coupled to the first reference voltage, the first bias transistor having a collector coupled to a first electrode and control electrode of a second current mirror transistor, and the second current mirror transistor having a second electrode coupled to the second reference voltage.

22. The operational amplifier circuit of claim 1 wherein the second stage includes third and fourth input transistors, first electrodes of the third and fourth input transistors being coupled to the tail current node and to the second tail current source, second electrodes of the third and fourth input transistors being coupled to a load circuit, one of the first and second electrodes of the fourth input transistor being coupled to the output conductor, and control electrodes of the third and fourth input transistors being coupled as the first and second inputs to the second electrodes of the first and second cascode transistors.

23. The operational amplifier circuit of claim 22 wherein the bias circuit includes a first bias transistor having a first electrode, a second electrode and a control electrode, the control electrode coupled to receive a second bias voltage, the first electrode coupled to the tail current conductor node and to a first electrode and control electrode of a first current mirror transistor, the first current mirror transistor having a second electrode coupled to the first reference voltage, the first bias transistor having a collector coupled to a first electrode and control electrode of a second current mirror transistor, and the second current mirror transistor having a second electrode coupled to the second reference voltage.

* * * * *